United States Patent [19]

Singh et al.

[11] Patent Number: 5,677,848
[45] Date of Patent: Oct. 14, 1997

[54] METHOD TO DERIVE THE FUNCTIONALITY OF A DIGITAL CIRCUIT FROM ITS MASK LAYOUT

[75] Inventors: Kanwar J. Singh, Matawan; Pasupathi A. Subrahmanyam, Freehold, both of N.J.

[73] Assignee: Lucent Technologies Inc., Murray Hill, N.J.

[21] Appl. No.: 552,421

[22] Filed: Nov. 3, 1995

[51] Int. Cl.$^6$ .................................................. G06F 17/50
[52] U.S. Cl. ........................ 364/489; 364/488; 364/578
[58] Field of Search ................................. 364/488, 489, 364/490, 491, 578; 395/500; 371/24, 25.1, 26

[56] References Cited

U.S. PATENT DOCUMENTS

| | | | |
|---|---|---|---|
| 5,084,824 | 1/1992 | Lam et al. | 364/490 |
| 5,384,720 | 1/1995 | Ku et al. | 364/578 |
| 5,493,508 | 2/1996 | Dangelo et al. | 364/489 |
| 5,544,071 | 8/1996 | Keren et al. | 364/489 |
| 5,572,436 | 11/1996 | Dangelo et al. | 364/489 |
| 5,579,510 | 11/1996 | Wang et al. | 395/500 |

OTHER PUBLICATIONS

Bryant, "Boolean Analysis of MOS Circuits", IEEE Trans. on CAD, vol. CAD-6, No. 4, Jul. 1987, 634-649.
Bryant, "Extraction of Gate Level Models from Transistor Circuits by Four-Valued Symbolic Arrays," 1991 ICCAD, 350-353.

Liao et al., "Boolean Behavior Extraction from Circuit Layout," MSU Department of Computer Science, 139-143. (No Date).

Stentovich et al., "Sequential Circuit Design Using Synthesis and Optimization," ICCD '92, 328-333.

Wehbeh et al., "Hierarchical Simulation of MOS Circuits Using Extracted Functional Models," ICCD '92, 512-515.

*Primary Examiner*—Kevin J. Teska
*Assistant Examiner*—Leigh Marie Garbowski

[57] ABSTRACT

A method for generating a simplified model of a complex binary transistor circuit. A set of Boolean functions are derived for the circuit and these functions are tested to determine if the circuit is stable and binary. All intermediate transient circuit configurations are eliminated so that only direct transitions between stable circuit configurations remain. If the circuit is also combinational, a logic circuit is generated. If the circuit is not combinational but if there is a clock input to the circuit that controls the values of the node (the circuit exhibits synchronous behavior) and all nodes in the circuit are well-defined (either combinational or level-sensitive), a logic circuit is generated. The logic circuit is processed to generate a further simplified logic circuit by merging different types of latches and other logic elements and removing duplicative logic elements.

10 Claims, 3 Drawing Sheets

METHOD TO DERIVE THE FUNCTIONALITY OF A DIGITAL CIRCUIT FROM ITS MASK LAYOUT

FIELD OF THE INVENTION

The present invention relates to determining the operational characteristics of complex electronic circuits.

BACKGROUND OF THE INVENTION

After a complex electronic circuit is designed, the designers typically need to determine whether the newly designed circuit operates as intended prior to the actual fabrication of the circuit which may be time consuming and expensive. To test the circuit design or net list, a number of circuit-level simulators, such as SPICE, are available that run a computer simulation of the circuit to determine its operational characteristics. Although such circuit-level simulators are functional and effective for certain circuits and for certain uses, these circuit simulators are impractical for large and complex circuits, such as VLSI circuits, employing a large number of transistors and other electronic elements, especially digital circuits, because the detailed data that they provide concerning the operational parameters of the circuits is often more detailed that is necessary. In particular, such circuit simulators typically provide voltage levels as a function of time at a large number of circuit nodes when for some designs data is needed for a much smaller number of nodes. As a consequence of the large amount of data that such circuit simulators provide, they typically require a substantial period of time to calculate this large amount of data.

Another circuit simulation technique, known as switch-level simulation, transforms a transistor circuit into interconnections of switches. During switch-level simulation, rather than evaluating the device equations to determine node voltages, multi-valued logic equations are evaluated to infer logic values at nodes in the circuit. Such switch-level simulation techniques can be modified to vary the delay assumptions that are made and the accuracy level of the node voltages represented, including binary, ternary, etc., node voltages. These circuit simulation models, which employ a simulation clock, describe the characteristics of the circuit from one time instant to the next. Discrete voltage values, such as 0, 5 and 10 volts, are used rather than a continuous spectrum of voltage values. The inputs for these models are thus the input voltage, the previous voltages of the nodes, the circuit dock signal, and the simulation dock input. Each cycle of the simulation clock results in an evaluation of the voltages of the nodes in the various parts of the circuit. The simulation clock changes its state much more frequently than a circuit clock input, with many cycles of the simulation clock taking place for a single cycle of the circuit clock. As a result, the entire circuit voltage characteristic can be obtained as a function of small discrete time intervals. This switch level circuit simulation technique, however, is still too detailed for many applications.

Logic simulation is a technique used for fast simulation of synchronous digital circuits. It uses a gate-level representation of the circuit consisting of an interconnection of logic gates and predefined memory elements called latches and flip-flops. Logic simulation involves evaluating the logic gates only once during a circuit clock cycle. This frequency of evaluation makes the logic simulation technique more efficient than switch-level simulation. Pattern matching has been proposed as a way of deriving a gate-level model equivalent to a transistor circuit. According to this method, the circuit to be analyzed is compared and matched to various circuits for which the operational characteristics are known. This technique is effective when the types of circuits that may be employed in a circuit are restricted to a known list of circuits. However, the pattern matching technique is not particularly useful and is difficult to implement for full custom designed circuits where circuit designers utilize their technical expertise to design smaller and more efficient circuits than known circuits. For custom designed circuits, it is thus possible that the pattern matching will be unable to recognize a particular circuit.

SUMMARY OF THE INVENTION

The present invention is directed to a method for generating a simplified gate-level model of a complex binary transistor circuit.

As used herein, the term "circuit configuration" refers to the set of signal values on the internal nodes of the circuit, the term "output values" refers to the set of values of the circuit outputs, and the term "input conditions" refers to the set of values, including clock signals that are provided as inputs to the circuit.

In accordance with the present invention, a transistor circuit or netlist is generated from a selected circuit mask layout by conventional methods. A simulation relation or a set of Boolean functions are derived for the circuit using any one of many standard techniques, such as the presently preferred TRANALYZE technique.

Next, the Boolean functions of the circuit are tested to determine if the circuit configurations are stable, i.e., if all node values remain constant as long as the input conditions remain constant. The Boolean functions are entered into a conventional binary decision diagram (BDD) program package which represents the circuit functions as binary decision diagrams. A circuit is classified as "stable" if there is a stable binary circuit configuration for every possible input condition. If the circuit does not pass this stability test, the circuit is rejected.

If the circuit passes the stability test, it undergoes a "Boolean" test. All possible circuit output values corresponding to the stable binary circuit configurations are evaluated to determine if they are binary valued. If the circuit does not pass this Boolean test, the circuit is rejected.

If the circuit also passes the Boolean test, a binary stable simulation relation is constructed using the relation generated by the BDD package. The BDD description of the circuit is analyzed for each stable circuit configuration to determine what transitions occur when input conditions are changed. All intermediate transient circuit configurations are then eliminated so that only direct transitions between stable binary circuit configurations remain. The Boolean equations for the circuit are then appropriately modified and thus simplified.

The circuit then undergoes a combinational test. A "combinational" circuit is one that generates a unique, binary output for every binary input applied to the primary inputs of the circuit, irrespective of the state of clock inputs and irrespective of past values of the inputs or nodes in the circuit. To pass this test, there must be no input condition for which any of the output values are non-binary, all possible binary input conditions must result only in binary output values, and the input conditions that produce binary 1 and 0 outputs must be mutually exclusive. For circuits that pass this test, a logic circuit is generated by using the BDD package in reverse.

Circuits that do not pass the combinational test are subjected to two other tests before being rejected. If at least one input signal to the circuit is a clock signal, then a synchronous test is performed; otherwise the circuit is rejected. A "synchronous" circuit is one for which its circuit configuration changes in response to a clock signal. In the synchronous test, each component and node of the stable simulation relation representing the circuit is analyzed using the BDD package to determine if the output values obtained are well-defined or undefined. Output values are "well-defined" if they are combinational or level-sensitive functions of other signals. A "combinational" signal is one that is independent of clock phase. Functions describing each node value are obtained for each of the two possible clock values. If these two functions corresponding to a node are identical, then the node is clock independent and classified as combinational. A node is "level-sensitive" if its value changes during one clock phase and remains unchanged during the rest of the clock cycle. If the circuit output values depend upon even one undefined component or node, then the circuit does not pass the synchronous test, and the circuit is rejected. For circuits that pass this test, a logic circuit is generated by using the BDD package in reverse. The information obtained in determining which nodes were combinational and which were level-sensitive is used by the BDD package to select the particular type of logic element to represent the nodes.

The logic circuit is then further processed by conventional means to generate a further simplified logic circuit by merging different types of latches and other logic elements and removing duplicative logic elements.

The final resulting register-transfer level model significantly simplifies the circuit representation so that simulated operation of this simplified model is much faster as it involves far fewer operations. By eliminating much of the unneeded detail of a complex circuit's operation, i.e., transient circuit configurations, circuit operation simulations of even digital large, full-custom-designed circuits can be completed rapidly and accurately. This simplified circuit may also be used to generate a circuit that is much simpler that the original complex circuit, thereby minimizing the number of electrical components and decreasing manufacturing costs.

Other objects and features of the present invention will become apparent from the following detailed description considered in conjunction with the accompanying drawings. It is to be understood, however, that the drawings are intended solely for purposes of illustration and not as a definition of the limits of the invention, for which reference should be made to the appended claims.

BRIEF DESCRIPTION OF THE DRAWINGS

In the drawings, wherein like reference numerals delineate similar elements throughout the several views.

DETAILED DESCRIPTION OF THE PRESENTLY PREFERRED EMBODIMENTS

Figure 1:
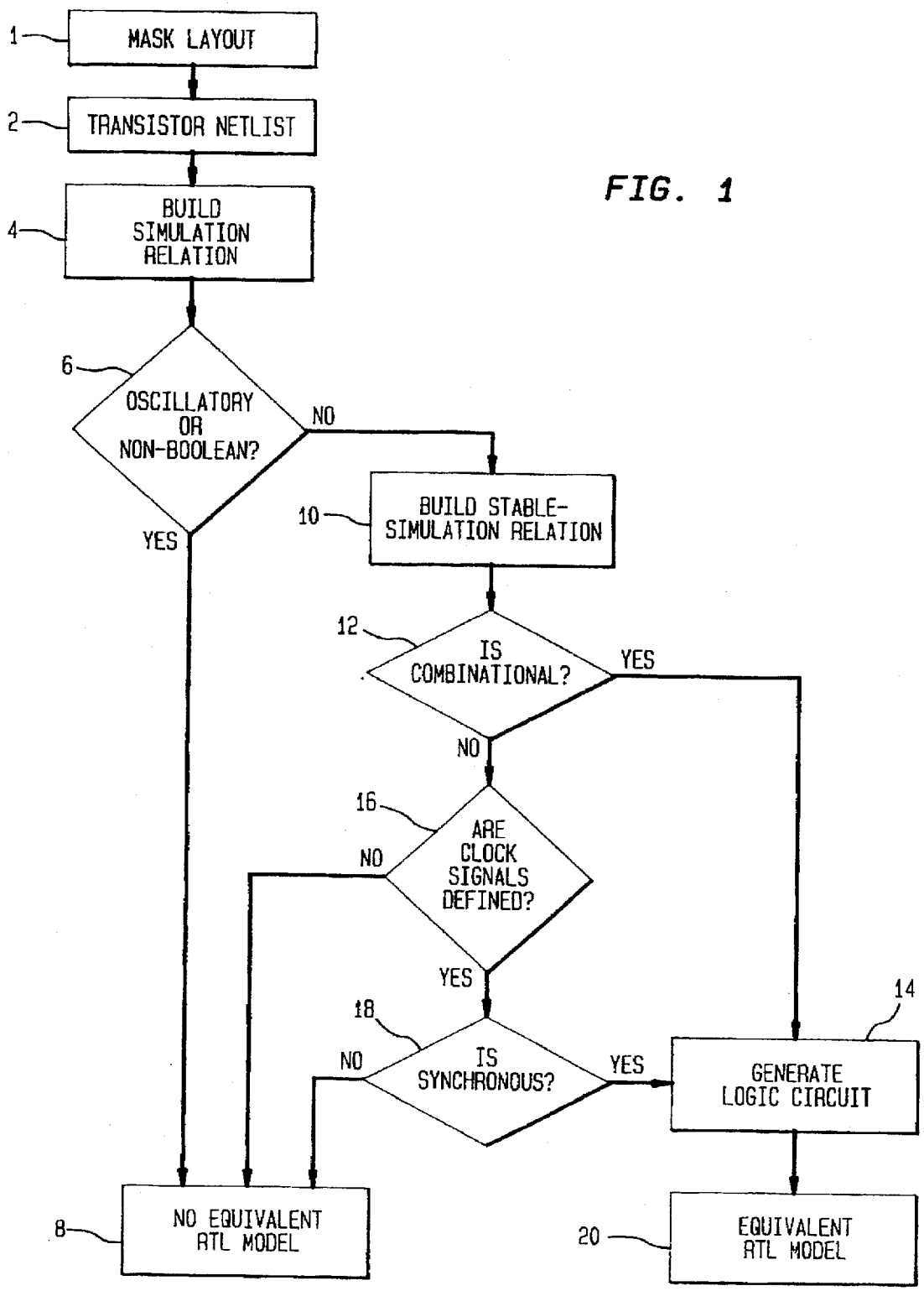
FIG. 1 is a simplified flow chart for a preferred embodiment of the method of the present invention.
Figure 3A:
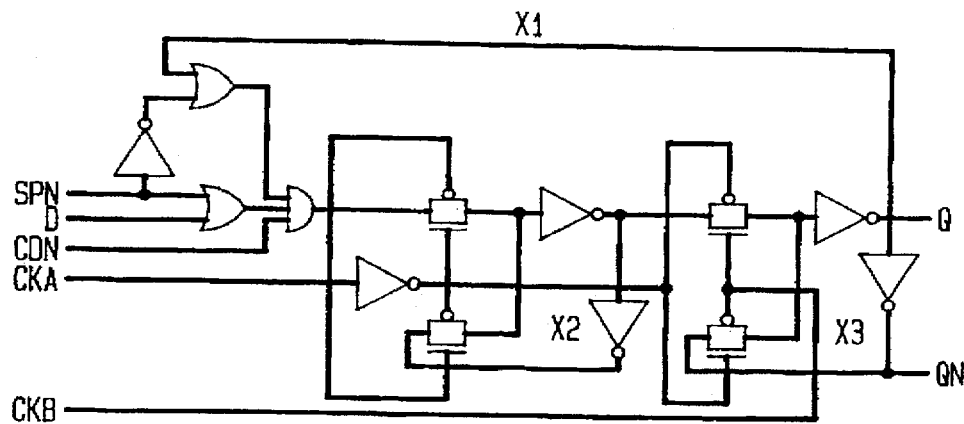
FIGS. 3A, 3B and 3C are diagrams for an exemplary circuit at various stages in the method of the present invention.

In FIG. 1 is shown a simplified flow chart for a preferred embodiment of the method of the present invention. First, a circuit mask layout is selected for analysis, block 1 and a transistor circuit or netlist is generated from that mask layout by conventional methods, block 2. An exemplary transistor circuit is shown in FIG. 3A where, for illustrative purposes, the various groups of transistors are represented by appropriate logic symbols. A simulation relation or a set of Boolean functions are derived for the circuit, block 4 of FIG. 1, using any one of many standard techniques. One such known technique is the presently preferred TRANALYZE technique which uses a four-valued representation for the signals and produces an interconnection of zero-delay logic functions and unit-delay elements. Unit-delay elements represent feedback arcs or charge-storage nodes in the circuit. The TRANALYZE technique is described in R. E. Bryant, "Extraction of Gate Level Models from Transistor Circuits by Four-Valued Symbolic Analysis", Proceedings of International Conference on Computer-Aided Design, pages 350–353, 1991, which is incorporated herein by reference. In obtaining these Boolean functions, it is assumed that all of the transistors in the selected circuit act as switches and that each node in the circuit has a capacitance, i.e., the nodes retains their voltage values for a period of time. The Boolean functions generated by TRANALYZE define each of node voltage values, one set of Boolean functions for each node, as functions of the inputs, including clock signals, and the other node values. These Boolean functions can be used to determine all of the possible node values for all possible input conditions. The technique will determine if a node value is high ("1"), low (or "0"), unknown (either "1" or "0"), or if it is not driven to either high or low but instead retains its previous value.

Next, it is determined whether the circuit is stable or oscillatory and whether the circuit is non-Boolean, block 6. A circuit is said to be "stable" if all output values remain the same so long as the input conditions remain the same. To determine if the circuit is stable, the Boolean functions generated by TRANALYZE are entered into a binary decision diagram (BDD) program package. A number of such BDD packages are available, and a presently preferred package is one developed at AT&T by David Long. Another suitable BDD package is part of the SIS logic synthesis tool developed at the University of California at Berkeley and described in E. M. Sentovich, et al., "Sequential Circuit Design Using Synthesis and Optimization", Proceedings of the International Conference on Computer Design, October 1992, which is incorporated herein by reference. The BDD package represents the circuit functions generated by TRANALYZE as binary decision diagrams and is used to determine all possible binary circuit configurations at which the circuit can stabilize. A circuit is classified as stable if there is a stable binary circuit configuration (i.e., the circuit configuration does not change so long as the input conditions do not change), for every possible input condition. For unstable circuits, it is determined that no equivalent register-transfer level model exists for the circuit, block 8, and the circuit is rejected, i.e., the analysis ends.

However, if the circuit passes the stability test described above, it is next determined whether the circuit is "Boolean" or not, block 6. To make this assessment, all possible circuit output values corresponding to the stable binary circuit configurations are evaluated to determine if they are binary valued, either high or low voltage values. If the output values are not binary, i.e, unknown, then it is again determined that no equivalent register-transfer level model exists for the circuit, block 8, and the analysis ends.

Figure 2:
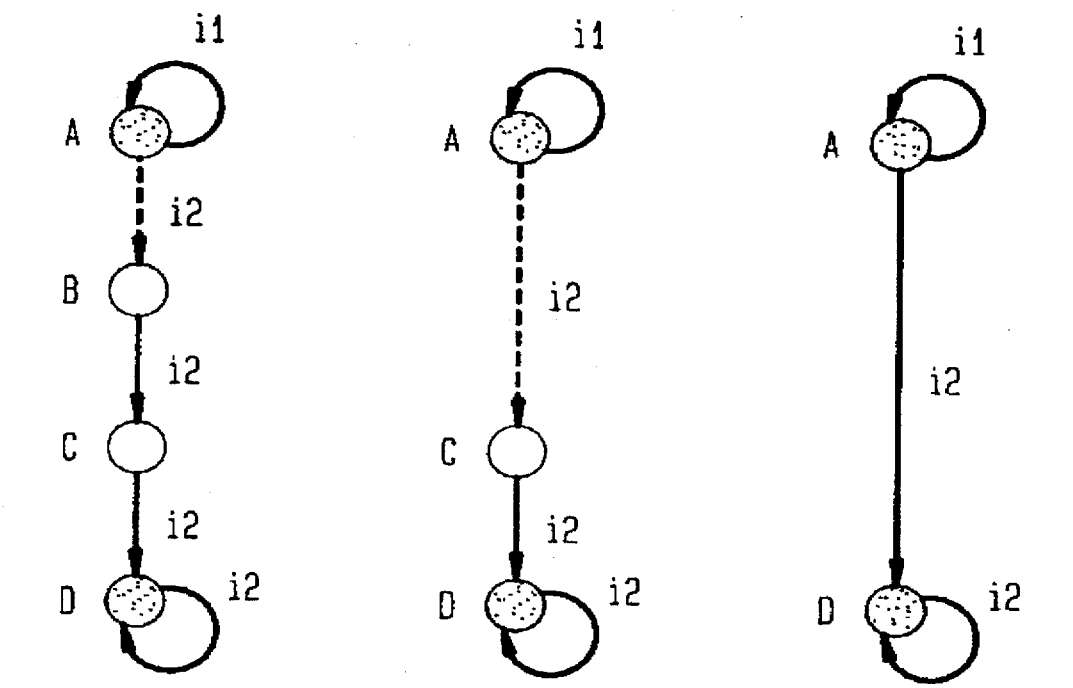
FIG. 2 is an illustration of the circuit simplification technique of one aspect of the present invention.

Next, for binary stable, Boolean circuits, a binary stable simulation relation is constructed using the relation generated by the BDD package, block 10. To do so, the BDD description of the circuit is analyzed for each stable circuit configuration to determine what transitions occur when input conditions are changed. All intermediate transient circuit configurations are then eliminated so that only direct transitions between stable circuit configurations remain. This elimination of intermediate transient circuit configurations is illustrated in FIG. 2. Referring to the left diagram, a binary stable circuit configuration A is shown for an input condition i1. The circular arrow at A indicates that so long as the input condition remains constant at i1, the circuit configuration remains A. However, when the input condition changes to i2, the circuit configuration initially changes to circuit configuration B, then to circuit configuration C, and finally to circuit configuration D. Since the circuit does not retain circuit configurations B or C as long as the input condition remains i2, circuit configurations B and C are not stable but intermediate and transitory. However, as indicated by the circular arrow at D, after the circuit has attained circuit configuration D, as long as the input condition remains i2, the circuit configuration remains D. Circuit configuration D is therefore a binary stable circuit configuration. Intermediate, transient circuit configurations, such as circuit configurations B and C, are eliminated from the model for the circuit, in stages as follows. When the input condition is changed, for example from i1 to i2 in FIG. 2, the new circuit configuration is compared to the list of known binary stable circuit configurations to determine if the new circuit configuration is in the list. If not, then the new circuit configuration is eliminated, in this case circuit configuration B, as shown in the center diagram in FIG. 2. This procedure is repeated until all transitions for changing input conditions are between binary stable circuit configurations, as shown in the right diagram in FIG. 2. The Boolean equations for the circuit are then appropriately modified to eliminate the transient circuit configurations. As a result of this elimination of transient circuit configurations, the model for the operation of the circuit is substantially simplified. The simulation relation for the circuit that results from this elimination of transient circuit configurations contains only binary stable circuit configurations, block 10 of FIG. 1.

Next, the circuit is tested to determine if it is combinational, block 12. A "combinational" circuit is one that generates a unique, binary output for every binary input applied to the primary inputs of the circuit, irrespective of the state of clock inputs and irrespective of past values of the inputs or nodes in the circuit. Thus, if there exists an input condition that can produce two or more distinct output values, the output is not determined uniquely by the circuit input conditions and must also depend on some signal or signals that are not circuit inputs, and such circuits are not combinational but sequential. The combinational test is performed by the BDD package on the stable simulation relation as follows. First, a completeness test is performed to confirm every possible binary input condition results only in binary output values. Second, a uniqueness test confirms that the input conditions that produce binary 1 and 0 outputs are mutually exclusive. If the circuit passes both tests, the circuit is declared combinational, and a logic circuit is generated, block 14.

A logic circuit is generated, block 14, by using the BDD package in its inverse function mode, i.e., it is used in reverse. The data listing the output values for the various inputs is loaded into the BDD package which then generates a gate-level logic circuit of the transistor netlist.

However, if the circuit is declared to be not combinational, two other tests are performed before the circuit is rejected from the simulation program. First, the user is queried if at least one input signal is a clock signal, block 16. If there is no input signal that is a clock signal, the circuit is rejected, block 8.

Figure 3B:
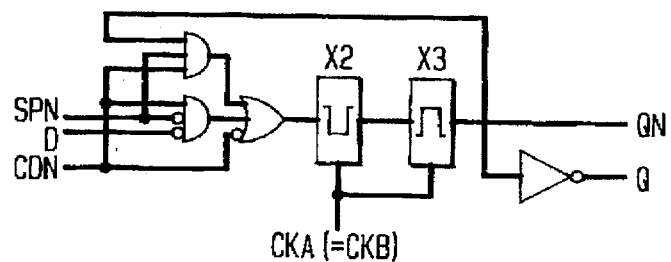

However, if at least one input is a clock signal, then the circuit is tested to determine if it is synchronous, block 18. A "synchronous" circuit is one for which its circuit configuration changes in response to a clock signal. Each node represented in the stable simulation relation generated in block 10 is then analyzed using the BDD package to determine if the output values obtained are well-defined or undefined. For simplicity of discussion, it is assumed that the circuit has two phase clocking (i.e., two distinct phases of each of the clock signals are repeated indefinitely). For each node, a function is obtained describing the node value for all possible values of all clock signals. For example, a clock value of 1 and a clock value of 0. Thus, two functions are obtained for each node, one describing the node value for a clock value of 1, for example, and another describing the node value for a clock value of 0, for example. Nodes are categorized as "well-defined" if they are combinational or level-sensitive functions of other signals. All nodes that are not well-defined are classified as "undefined". A "combinational" signal is one that is independent of clock phase. If the two functions corresponding to the two clock phases are identical, then the node is clock independent and classified as combinational. These functions are obtained and these tests are performed by the BDD package. If a node fails this combinational test, the node is tested to see if it is level-sensitive. A node is "level-sensitive" if its value changes during one clock phase and remains unchanged during the rest of the clock cycle. This can be determined by examining the two functions corresponding to the two clock phases. Such nodes are considered as outputs of combinational functions that have been latched. The particular type of latch that the function describes is determined by which clock phase activates the latch. Consequently, each of the nodes are classified as either well-defined or undefined. If the circuit output depends upon even one undefined component or node, then the circuit is classified as asynchronous and the circuit is rejected, block 8. However, if the output of the entire circuit is dependent only upon well-defined components and nodes, then the circuit is classified as synchronous, and a logic circuit is generated, block 14, by using the BDD package in reverse to generate a gate-level logic circuit of the transistor netlist. The information obtained in determining which nodes were combinational and which were level-sensitive is used by the BDD package to select the particular type of logic element to represent the nodes. An example of a logic circuit obtained at this point is shown in FIG. 3B which is a version of the circuit shown in FIG. 3A simplified in accordance with the method of the present invention.

Figure 3C:
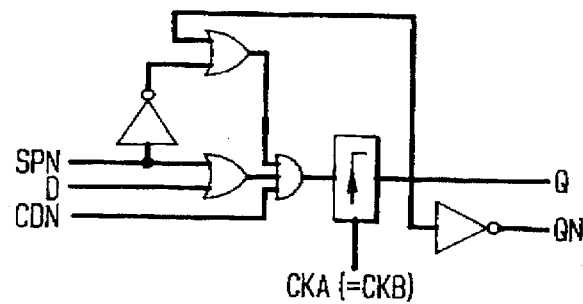

Post-processing of the logic circuit is then conducted, block 20, to generate a further simplified logic circuit, as shown in FIG. 3C. This post-processing is performed by conventional means by merging different types of latches and other logic elements and removing duplicative logic elements.

As can be seen from comparing the initial circuit representation shown in FIG. 3A with the final resulting register-transfer level model of the circuit shown in FIG. 3C, the circuit model has been significantly simplified. Simulated operation of this simplified model clearly involves far fewer operations than for the initial circuit, thus providing results much faster. In addition, it is also possible to substitute a simplified circuit corresponding the simplified model generated by the present invention for the original more complex circuit, thereby minimizing the number of electrical components that must be used to perform the same function and decreasing the manufacturing cost of the circuit.

The present method has been successfully used to accurately characterize several custom-designed large circuits as well as the entire AT&T standard-cell circuit library.

Thus, while there have been shown and described and pointed out fundamental novel features of the invention as applied to a preferred embodiment thereof, it will be understood that various omissions and substitutions and changes in the form and details of the method described may be made by those skilled in the art without departing from the spirit of the invention. For example, it is expressly intended that all combinations of those method steps which perform substantially the same function in substantially the same way to achieve the same results are within the scope of the invention. Substitutions of steps from one described embodiment to another are also fully intended and contemplated. It is the intention, therefore, to be limited only as indicated by the scope of the claims appended hereto.

What is claimed is:

1. A method for generating a gate-level logic model of a transistor circuit having a plurality of circuit nodes, the circuit attaining an output value in response to an input condition, comprising:

(A) deriving a plurality of Boolean functions for the circuit that describe operation of the circuit and provide signal values at nodes of the circuit upon application of the input condition;

(B) analyzing the Boolean functions to determine whether the circuit is stable;

(C) upon determining in step (B) that the circuit is stable, evaluating the Boolean functions to determine whether all possible output values have binary values;

(D) upon determining in step (C) that all possible output values of the circuit have binary values, generating a binary stable simulation relation for the circuit from the Boolean functions by:

(i) determining all stable signal values of the nodes of the circuit;

(ii) determining all stable node signal values of the circuit that result upon a change in an input condition; and (iii) modifying the Boolean functions to eliminate all intermediate node signal values that are not stable node signal values to generate the binary stable simulation relation;

(E) evaluating the binary stable simulation relation to determine whether each input condition generates only one binary circuit output value;

(F) upon determining in step (E) that each input condition generates only one binary circuit output value for each input condition, generating the gate-level logic model of the circuit from the binary stable simulation relation;

(G) upon determining in step (E) that each input condition generates more than one binary circuit output value, determining whether any input conditions reflect a clock signal;

(H) upon determining in step (G) that at least one input condition reflects a clock signal, evaluating the binary stable simulation relation for each of the nodes of the circuit to determine whether signal values for each of the nodes are well-defined for all possible input conditions by determining for each node whether the node is one of combinational and level-sensitive;

(I) upon determining in step (H) that signal values for each of the nodes are well-defined for all possible input conditions, functionally modifying the binary stable simulation relation to reflect which nodes have been determined in step (H) to be one of combinational and level-sensitive; and (J) generating the gate-level logic model of the circuit from the modified binary stable simulation relation generated in step (I).

2. The method of claim 1, wherein the step (H) of determining whether a node is combinational comprises determining whether a function describing the node for a clock input is identical to another function describing the node for another clock input.

3. The method of claim 1, wherein the step (H) of determining whether a node is level-sensitive comprises determining whether functions describing the node change during one phase of each clock signal and not during another phase of the clock signal.

4. The method of claim 2, wherein the step (H) of determining whether a node is level-sensitive comprises determining whether functions describing the node change during one phase of each clock signal and not during another phase of the clock signal.

5. The method of claim 1, wherein the step (B) of determining whether the circuit is stable comprises determining that the circuit is stable if the node signal values remain the same as long as the input condition remains the same.

6. The method of claim 1, wherein the step (B) of determining whether the circuit is stable comprises determining that the circuit is stable if each possible input condition result in respective node signal values that remain the same as long as the input condition remains the same.

7. The method of claim 1, wherein the step (D) of determining stable node signal values comprises determining that a node signal value is stable if the node signal value remains the same as long as the input condition remains the same.

8. The method of claim 1, further comprising (K) processing the gate-level logic model so as to simplify the model by combining elements in the model.

9. A method for generating a gate-level model of a transistor circuit from a plurality of Boolean functions describing the circuit, the circuit having a plurality of circuit nodes and attaining an output value in response to an input condition, comprising:

determining all stable signal values of the nodes of the circuit;

determining all stable node signal values of the circuit that result upon a change in an input condition;

modifying the Boolean functions to eliminate all intermediate node signal values that are not stable node signal values;

generating the gate-level logic model of the circuit from the modified Boolean functions.

10. The method of claim 9, wherein the steps of determining stable node signal values comprises determining that a node signal value is stable if the node signal value remains the same as long as the input condition remains the same.

* * * * *